(12) United States Patent
Kim

(10) Patent No.: US 7,538,374 B2
(45) Date of Patent: May 26, 2009

(54) CMOS IMAGE SENSOR AND METHOD FOR FABRICATING THE SAME

(75) Inventor: Yeon Sil Kim, Sewong (KR)

(73) Assignee: Dongbu Electronics Co., Inc. (KR)

(*) Notice: Subject to any disclaimer, the term of this patent is extended or adjusted under 35 U.S.C. 154(b) by 0 days.

(21) Appl. No.: 11/225,637

(22) Filed: Sep. 12, 2005

(65) Prior Publication Data

US 2006/0097295 A1    May 11, 2006

(30) Foreign Application Priority Data

Nov. 9, 2004 (KR) .................... 10-2004-0090795

(51) Int. Cl.
*H01L 31/062* (2006.01)
(52) U.S. Cl. .................... 257/294; 257/204
(58) Field of Classification Search ............ 257/292, 257/204, 274, E27.062, E27.063, E27.064, 257/E27.065, E27.066, E27.067, 294
See application file for complete search history.

(56) References Cited

U.S. PATENT DOCUMENTS

| | | | |
|---|---|---|---|
| 5,466,926 A | | 11/1995 | Sasano et al. |
| 6,043,001 A | | 3/2000 | Hirsh et al. |
| 6,168,966 B1 | * | 1/2001 | Fan et al. .................... 438/73 |
| 6,255,640 B1 | * | 7/2001 | Endo et al. .............. 250/208.1 |
| 6,417,022 B1 | | 7/2002 | Hsiao et al. |
| 6,643,386 B1 | | 11/2003 | Foster |
| 6,674,470 B1 | * | 1/2004 | Tanaka et al. .............. 348/302 |
| 6,794,215 B2 | * | 9/2004 | Park et al. .................... 438/69 |
| 6,956,253 B2 | | 10/2005 | Weng et al. |
| 6,964,916 B2 | | 11/2005 | Kuo et al. |
| 6,974,715 B2 | * | 12/2005 | Lee .............................. 438/48 |
| 7,115,853 B2 | * | 10/2006 | Jiang et al. .............. 250/208.1 |
| 7,169,633 B2 | | 1/2007 | Huang et al. |
| 2002/0020845 A1 | * | 2/2002 | Ogura et al. .................... 257/88 |
| 2002/0058388 A1 | | 5/2002 | Ryum et al. |
| 2002/0079504 A1 | | 6/2002 | Kim |
| 2004/0129990 A1 | * | 7/2004 | Lee ............................ 257/428 |

(Continued)

FOREIGN PATENT DOCUMENTS

JP    5-090550    4/1993

(Continued)

OTHER PUBLICATIONS

Jun Hwang; Image sensor and manufacturing method thereof; Korean Patent Abstracts; Jun. 24, 2002; Publication No. KR 1020020048707 A; Korean Intellectual Property Office, Republic of Korea.

(Continued)

*Primary Examiner*—N Drew Richards
*Assistant Examiner*—Swapneel Chhaya
(74) *Attorney, Agent, or Firm*—Andrew D. Fortney

(57) ABSTRACT

A CMOS image sensor and a method for fabricating the same are disclosed, in which the fabrication costs are reduced by reducing the number of photolithographic processes and yield is improved by obviating an alignment problem between color filter layers and microlenses. In one embodiment, the CMOS image sensor includes a sub layer provided with a unit pixel (e.g., a photodiode and various transistors), a planarization layer on the sub layer, and microlens-color filter structures formed on the planarization layer at constant intervals.

23 Claims, 5 Drawing Sheets

U.S. PATENT DOCUMENTS

| | | |
|---|---|---|
| 2004/0238908 A1 | 12/2004 | Hashimoto |
| 2005/0090035 A1 | 4/2005 | Kim |
| 2005/0139752 A1* | 6/2005 | Min .................. 250/214.1 |
| 2005/0269656 A1 | 12/2005 | Shian-Ching et al. |
| 2006/0011813 A1 | 1/2006 | Park et al. |
| 2006/0038209 A1 | 2/2006 | Hashimoto |
| 2006/0138485 A1 | 6/2006 | Jung |
| 2006/0138500 A1 | 6/2006 | Kim |
| 2006/0138578 A1 | 6/2006 | Lim |
| 2006/0148160 A1 | 7/2006 | Kim |
| 2006/0273361 A1* | 12/2006 | Tanaka et al. .......... 257/292 |

FOREIGN PATENT DOCUMENTS

| | | |
|---|---|---|
| KR | 2002-0048707 A | 6/2002 |

OTHER PUBLICATIONS

Seki Hiromichi; Manufacturing method of solid-state image pick-up device; Patent Abstracts of Japan; Apr. 9, 1993; Publication No. JP 05-090550; Japanese Intellectual Property Office, Japan.

Yeong Sil Kim; Self-Aligned Image Sensor and Method for Fabricating the Same; U.S. Appl. No. 11/205,543, filed Aug. 18, 2005.

Yeong Sil Kim; Method of Fabricating CMOS Image Sensor; U.S. Appl. No. 11/246,893, filed Oct 7, 2005.

People's Republic of China Office Action; Application No. 2005-10108081.8; Dated: Dec. 14, 2007; State Intellectual Property Office of People's Republic of China; People's Republic of China.

* cited by examiner

CMOS IMAGE SENSOR AND METHOD FOR FABRICATING THE SAME

This application claims the benefit of Korean Patent Application No. P2004-90795, filed on Nov. 09, 2004, which is hereby incorporated by reference in its entirety as if fully set forth herein.

BACKGROUND OF THE INVENTION

1. Field of the Invention

The present invention relates to an image sensor and a method for fabricating the same. More particularly, the invention relates to a complementary metal-oxide semiconductor (CMOS) image sensor, and a method for fabricating the same, in which the fabricating cost is reduced by reducing photolithographic processes and yield is improved by obviating an alignment problem between color filter layers and microlenses.

2. Discussion of the Related Art

Generally, an image sensor is a semiconductor device that converts optical images to electrical signals. Semiconductor image sensors may be classified into charge coupled device (CCD) image sensors and CMOS image sensors.

The CMOS image sensor includes a photodiode area for sensing light and a CMOS logic circuit area for processing the sensed light to generate electrical signals. The photosensitivity characteristics of a photodiode may be dependent upon the dimensions of the photodiode. Generally, if the light-sensing area of the photodiode is large, the image sensor will have excellent photosensitivity characteristics.

To improve photosensitivity, it is necessary to increase the fill factor (i.e., the area occupied by the photodiode within the whole area of the image sensor). Alternatively, it may be necessary to change the path of incident light that may be directed toward an area other than the photodiode so as to converge light on the photodiode.

A microlens is generally used to converge light on the photodiode. A convex microlens made of material having good light transmittance characteristics is formed over the photodiode to refract a path of incident light, thereby transmitting and/or irradiating more light to the photodiode. In this case, light parallel to a light axis of the microlens is refracted by the microlens so that a focal point is formed at a certain position of or along the light axis.

CMOS image sensors may be classified into a three-transistor (3T) type, a four-transistor (4T) type, and a five-transistor (5T) type, depending on the number of transistors per unit pixel or photodiode. The 3T type CMOS image sensor includes a photodiode and three transistors. The 4T type CMOS image sensor includes a photodiode and four transistors. The 5T type CMOS image sensor includes a photodiode and five transistors. An equivalent circuit and a layout of a unit pixel of the 3T type CMOS image sensor will now be described with reference to FIGS. 1-3.

FIG. 1 is an equivalent circuit diagram illustrating a general 3T type CMOS image sensor. FIG. 2 is a layout illustrating a general 3T type CMOS image sensor. FIG. 3 is a sectional view illustrating the related art CMOS image sensor.

A unit pixel of the 3T type CMOS image sensor, as shown in FIG. 1, includes a photodiode PD and three NMOS transistors T1, T2 and T3. A cathode of the photodiode is connected to a drain of the first NMOS transistor T1 and a gate of the second NMOS transistor T2. Sources of the first and second NMOS transistors T1 and T2 are connected to a power line supplied with a reference voltage VR. A gate of the first NMOS transistor T1 is connected to a reset line supplied with a reset signal RST. Further, a source of the third NMOS transistor T3 is connected to a drain of the second NMOS transistor T2. The drain of the third NMOS transistor T3 is connected to a read circuit (not shown) through a signal line, and its gate is connected to a heat selection line supplied with a heat selection signal SLCT. Therefore, the first NMOS transistor T1 may be called a reset transistor Rx, the second NMOS transistor T2 may be called a drive transistor Dx, and the third NMOS transistor T3 may be called a selection transistor Sx.

In the unit pixel of the 3T type CMOS image sensor, as shown in FIG. 2, a photodiode 20 is formed in a wide portion of an active area 10, and gate electrodes 30, 40 and 50 of three transistors Rx, Dx, and Sx, respectively, are formed overlapping the remaining portion of the active area 10. In other words, the reset transistor Rx is defined in part by the gate electrode 30, the drive transistor Dx is defined in part by the gate electrode 40, and the selection transistor Sx is defined in part by the gate electrode 50. Impurity ions are implanted into the active area 10 of each transistor except portions below the gate electrodes 30, 40 and 50, to form the source and drain areas of each transistor Rx, Dx, and Sx. A power voltage Vdd is applied to the source areas between the reset transistor Rx and the drive transistor Dx. The drain of the selection transistor Sx is connected to a read circuit (not shown).

The gate electrodes 30, 40 and 50 are each provided with a pad at one end to enable connection to a signal line (not shown) from a respective external driving circuit (not shown).

Hereinafter, a related art CMOS image sensor having microlenses will be described with reference to FIG. 3. FIG. 3 is a sectional view illustrating the related art CMOS image sensor.

As shown in FIG. 3, the related art CMOS image sensor includes a sub (or substrate) layer 11 having photodiode areas and metal lines formed in a semiconductor substrate (not shown) to generate charges in response to incident light, a dielectric interlayer 12 formed on an entire surface of the sub layer 11, color filter layers 13 of red (R), green (G) and blue (B) formed on the dielectric interlayer 12 to respectively pass light of specific wavelengths to the photodiode areas, a planarization layer 14 formed on the color filter layers 13, and convex microlenses 15 having a certain curvature formed on the planarization layer 14 to converge light onto its corresponding color filter in color filter layers 13, thereby converging color-separated light on the photodiode areas.

Although not shown, a light-shielding layer may be formed in the dielectric interlayer 12 to prevent light from entering an area other than the photodiode areas. The CMOS image sensor may contain photogates, rather than photodiodes, for sensing light.

Each of the R, G and B color filter layers 13 is formed by a photolithography-etching process using a separate mask after depositing a corresponding photosensitive material.

Furthermore, the curvature and the height of the microlenses 15 are determined by considering various factors, such as the focal point of converged light. A photoresist is generally used to form the microlenses 15. The microlenses 15 are formed by deposition, patterning and reflow processes.

However, the related art CMOS image sensor and the method for fabricating the same have several problems.

First, since the color filter layers are formed below the microlenses, a misalignment problem may occur in operation of the image sensor if alignment of the microlenses 15 and the color filter layers 13 is beyond a limit range, thereby possibly resulting in a failure to display normal color.

Second, since the microlenses 15 are formed by reflowing the resist at a temperature between 150° C. and 200° C., they are susceptible to variations in temperature and thickness of the resist. Such factors may lead to alignment errors between the microlenses 15 and the color filter layers 13, thereby reducing yield.

Finally, since the color filter layers 13 and the microlenses 15 are formed respectively by separate photolithographic processes, the number of photolithographic processes is increased. This increases fabrication costs.

SUMMARY OF THE INVENTION

Accordingly, the present invention is directed to a CMOS image sensor and a method for fabricating the same that substantially obviates one or more problems due to limitations and disadvantages of the related art.

An object of the present invention is to provide a CMOS image sensor and a method for fabricating the same, in which the fabricating cost is reduced by reducing photolithographic processes and yield is improved by obviating an alignment problem between color filter layers and microlenses.

Additional advantages, objects, and features of the invention will be set forth at least in part in the description that follows and which in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a CMOS image sensor according to the present invention comprises a sub layer comprising a photodiode and a plurality of transistors, a planarization layer on the sub layer, and unitary microlens-color filter structures on the planarization layer at constant intervals.

In another aspect of the present invention, a method for fabricating a CMOS image sensor comprises forming a planarization layer on an entire surface of a sub layer provided with a photodiode and a plurality of transistors, forming a plurality of color filter layers on the planarization layer at constant intervals, and forming microlens from the color filter layers by reflowing the color filter layers.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 4:
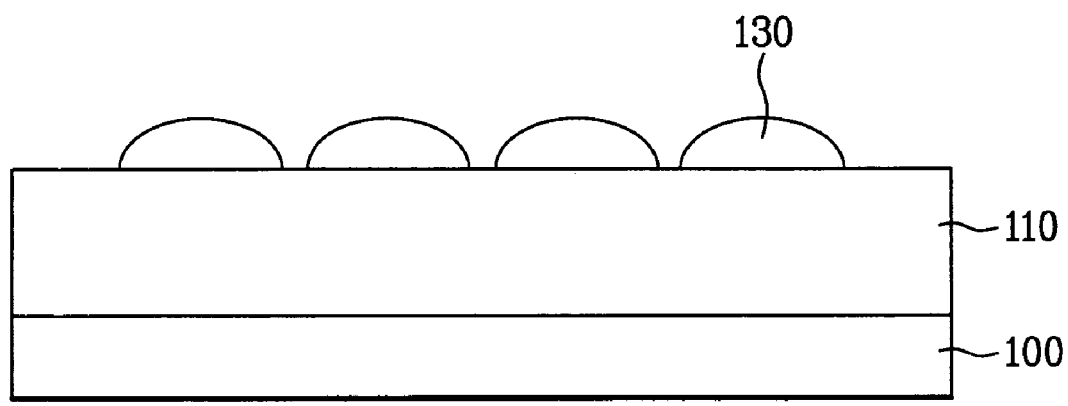
FIG. 4 is a sectional view illustrating a CMOS image sensor according to an embodiment of the present invention.

FIG. 4 is a sectional view of a CMOS image sensor according to an embodiment of the present invention.

Figure 1:
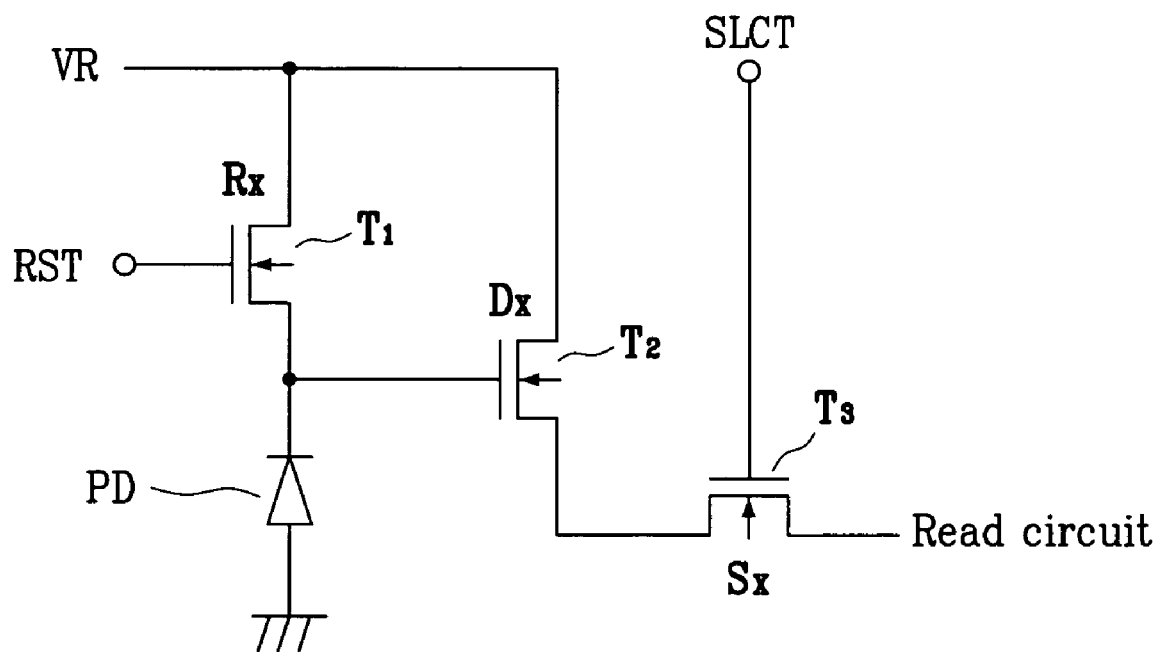
FIG. 1 is an equivalent circuit diagram illustrating a general 3T type CMOS image sensor.
Figure 2:
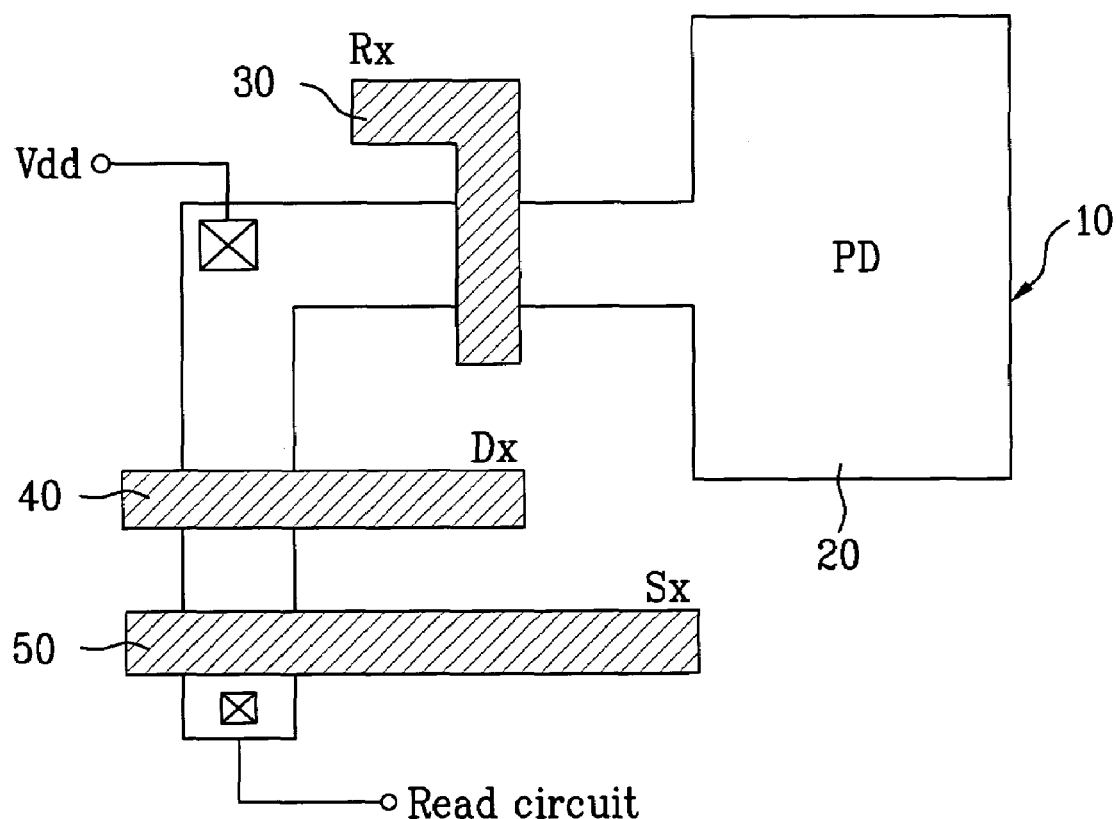
FIG. 2 is a layout illustrating a general 3T type CMOS image sensor.
Figure 3:
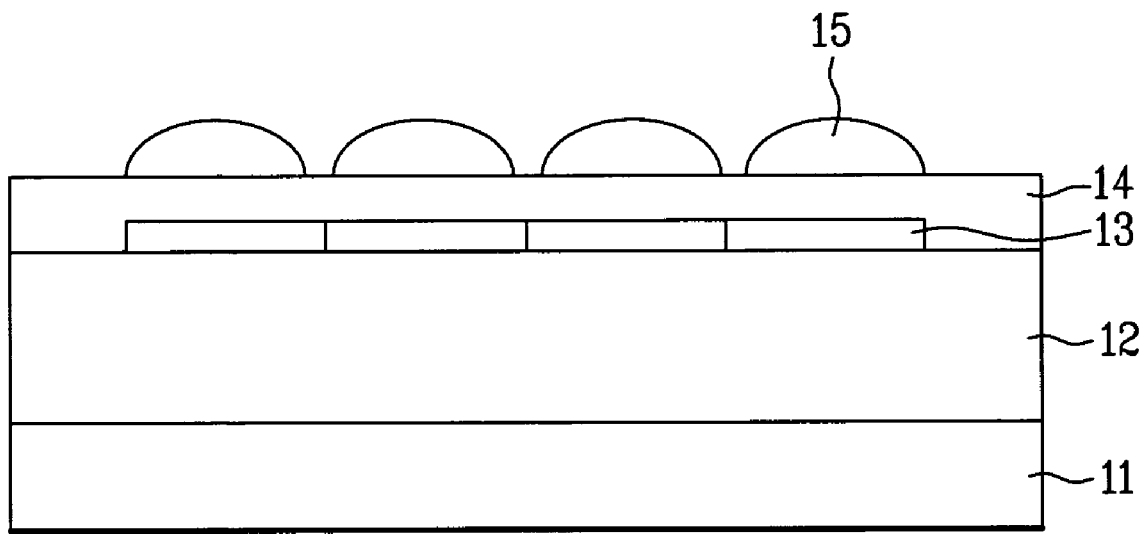
FIG. 3 is a sectional view of a related art CMOS image sensor.

As shown in FIG. 4, the CMOS image sensor according to an embodiment of the present invention comprises a planarization layer 110 formed on an entire surface of a sub layer 100 and a plurality of microlenses 130 having or providing a color filter function formed on the planarization layer 110 at substantially constant intervals. The sub layer 100 is provided with a unit pixel (not shown) comprising (i) a light-receiving area such as a photodiode and (ii) CMOS logic, such as the various transistors described above (e.g., Rx, Dx, and Sx in FIGS. 1-2).Photodiodes may be replaced with other light transducers, such as photogates. The unit pixel may comprise any of a variety of CMOS logic circuits, e.g., 3T, 4T, 5T types.

The microlens-color filter structures 130 may serve as color filter layers R, G and B, or as color filter layers in other color schemes, such as yellow, magenta, and cyan.

Figure 5A:
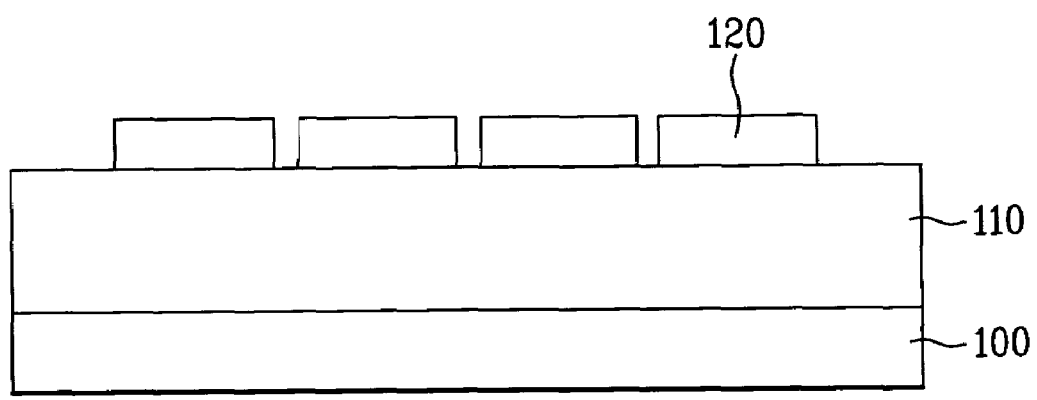
FIG. 5A and FIG. 5B are sectional views illustrating process steps of fabricating a CMOS image sensor according to an embodiment of the present invention.
Figure 5B:
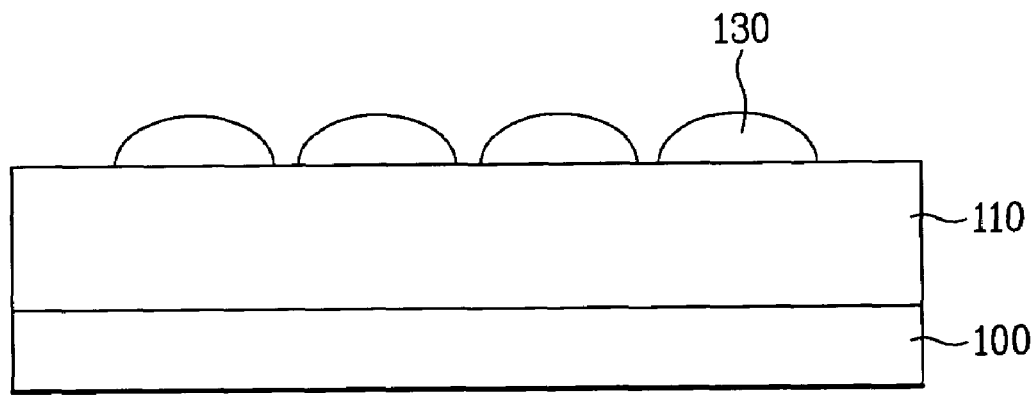

FIG. 5A and FIG. 5B are sectional views illustrating process steps of fabricating the CMOS image sensor according to an embodiment of the present invention.

As shown in FIG. 5A, a planarization layer 110 is formed on an entire surface of a sub layer 100 provided with a light-receiving area such as a photodiode and various transistors to constitute a unit pixel (not shown). An array of unit pixels (not shown) may be formed on and/or in sub layer 100.

Planarization layer 110 may be formed by, for example, CVD (chemical vapor deposition). The surface of the planarizing layer 110 may be planarized by, for example, CMP (chemical mechanical polishing), reflowing, etchback, etc. Planarization is carried out to remove variations in coating thickness and/or layer height (e.g., from the photosensor) that may lead to performance problems (e.g., discoloration brought about by the varying topography of a lower layer). The thickness and/or height variations may induce intensity variations in transmitted radiation to bring about unpredictable photodiode responses, thereby degrading product performance.

Color filter layers 120, e.g., R, G and B, are sequentially formed on the planarization layer 110. Color filters 120 are generally formed in correspondence or alignment with unit pixels (not shown, but generally located in an underlying portion of sublayer 100) configured to receive illumination radiating through color filters 120. Each of the color filter layers 120 may have a thickness of 1 μm to 5 μm and may be formed by depositing a corresponding photoresist material and patterning the photoresist material through a photo-etching process using a separate mask (generally for each color filter layer). Each of the color filter layers 120 serves to filter light depending on the wavelength absorption/transmission characteristics of each color filter layer.

In some embodiments, color filter layers 120 may be formed by first forming a sacrificial oxide layer (not shown) on the planarizing layer 110, e.g., by blanket deposition (e.g., CVD, such as PE-CVD or HDP-CVD, from silicon sources such as TEOS or silane ($SiH_4$), and oxygen sources such as ozone ($O_3$) or oxygen ($O_2$)), as is known in the art. This process is described in greater detail in U.S. application Ser. No. 11/205,543, filed on Aug. 16, 2005, the relevant portions of which are incorporated herein by reference, and may be advantageously done in cases where the planarization layer 110 comprises a material having a lower etch rate than the sacrificial oxide layer.

After the oxide layer (not shown) is formed on the planarizing layer 110, a photoresist (not shown) is coated thereon. Then, an exposure and development process is performed. Using the photoresist pattern as an etching mask, the oxide layer (not shown) is etched, whereby the oxide layer has or is provided with a predetermined pattern. The patterned oxide layer may be easily removed by a selective etching process after completion of the formation of color filter layers 120.

Having patterned the oxide layer (not shown), a resist (not shown) for a blue color filter is coated or deposited in one or more openings of the patterned oxide layer exposing portions of the planarization layer 110. An exposure and development process (and optionally, a planarization process) is performed on the blue color filter resist, thereby forming a blue resist pattern, which is identified as one of the color filter layers 120.

This procedure is repeated for other color filters, e.g., red and green. Thus, the resists for blue, red and green color filters are formed on the exposed portions of the planarization layer 110 and in the openings in patterned oxide layer (not shown). Thereafter, the patterned oxide layer (not shown) is removed.

Alternatively, the individual color filters (e.g., red, green and blue, or yellow, magenta and cyan) are formed one at a time by conventional photolithography and development or etching, directly on the planarization layer 110, without the use of a sacrificial layer. Naturally, the order of fabricating the color filters and the colors and color schemes themselves may be changed from one embodiment to the next.

As shown in FIG. 5B, the microlenses 130 for the unitary microlens-color filter structures are formed by reflowing the color filter layers 120 formed on the planarization layer 110. The reflow temperature may be between 100° C. and 250° C., but is preferably at a temperature between 150° C. and 200° C. In practice, the actual reflow temperature or temperature range may depend upon a number of variables known to those of skill in the art (e.g., the particular material used, the desired lens shape, etc.). An array of microlens-color filter structures may be formed on planarization layer 110 in alignment with an array of unit pixels on sub layer 100. In some embodiments, the microlenses 130 are separately formed in such a manner that they are spaced apart from one another. The spacing may vary from one embodiment to the next, down to zero spacing. Spacing is dependent on a number of factors, including alignment with underlying image sensor elements (not shown). In some embodiments, spacing may be at substantially constant intervals.

As described above, the CMOS image sensor and the method for fabricating the same according to the present invention have the following advantages.

Since the color filter layers and the microlenses are formed in a single body, it is possible to minimize misalignment between the color filter layers and the microlenses, thereby improving yield.

In addition, since the microlenses are formed by reflowing the color filter layers, the color filter layers and the microlenses can be formed simultaneously by performing one photolithographic process. Therefore, it is possible to reduce the fabrication costs.

Furthermore, the self-aligned image sensor according to the present invention may have improved light-transmitting efficiency, since there are no intervening layers or interfaces between the microlens and color filter (which, under typical conditions, may reflect some light back towards the surface of a conventional CMOS image sensor).

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A CMOS image sensor comprising:
a sub layer comprising a plurality of photodiodes and a plurality of transistors;
a planarization layer on the sub layer; and
microlens-color filter structures on the planarization layer, spaced at substantially constant intervals, wherein each of the microlens-color filter structures comprises a convex photoresist material that converges light onto a corresponding photodiode of the plurality of photodiodes and that has light wavelength absorption/transmission characteristics to serve as a color filter.

2. The CMOS image sensor according to claim 1, wherein the microlens-color filter structures have a thickness of 1 μm to 5 μm.

3. The CMOS image sensor according to claim 1, wherein the plurality of transistors comprises a reset transistor, a drive transistor and a selection transistor.

4. The CMOS image sensor according to claim 1, wherein the microlens-color filter structures comprise red, blue, and green color filters.

5. The CMOS image sensor according to claim 1, wherein the microlens-color filter structures comprise yellow, magenta, and cyan color filters.

6. A method for fabricating a CMOS image sensor comprising:
forming a planarization layer on a surface of a sub layer comprising a plurality of photodiodes and a plurality of transistors;
forming a plurality of color filter layers on the planarization layer at constant intervals, each color filter layer comprising a photoresist material having light wavelength absorption/transmission characteristics that serve to filter light; and
reflowing the color filter layers to form convex microlens-color filter structures, each of which converges light onto a corresponding photodiode of the plurality of photodiodes.

7. The method according to claim 6, wherein reflowing is performed at a temperature of from 100° C. to 250° C.

8. The method according to claim 6, wherein reflowing is performed at a temperature of from 150° C. to 200° C.

9. The method according to claim 6, wherein the microlens-color filter structures have a thickness of 1 μm to 5 μm.

10. The method according to claim 6, wherein the planarization layer comprises one of a nitride layer and an oxide layer.

11. The method according to claim 6, further comprising forming a color filter patterning layer prior to forming the plurality of color filters.

12. The method according to claim 11, further comprising removing the color filter patterning layer after fanning the plurality of color filters.

13. A CMOS image sensor comprising:
a substrate comprising an array of photosensors and CMOS logic;
a planarization layer on the substrate; and a plurality of unitary microlens-color filter structures on the planarization layer, wherein each of the microlens-color filter structures comprises a convex photoresist material that converges light onto a corresponding photodiode and that has light wavelength absorption/transmission characteristics to serve as a color filter.

14. The CMOS image sensor according to claim 13, wherein the microlens-color filter structures have a thickness of 1 µm to 5 µm.

15. The CMOS image sensor according to claim 13, wherein each of the photosensors comprise a photodiode.

16. The CMOS image sensor according to claim 13, wherein the CMOS logic comprises a plurality of transistors.

17. The CMOS image sensor according to claim 16, wherein the plurality of transistors comprises a reset transistor, a drive transistor and a selection transistor.

18. The CMOS image sensor according to claim 13, wherein the microlens-color filter structures comprise red, blue, and green color filters, or yellow, magenta, and cyan color filters.

19. The CMOS image sensor according to claim 1, wherein each microlens-color filter structure consists essentially of a unitary, reflowed photoresist.

20. The CMOS image sensor according to claim 13, wherein each microlens-color filter structure consists of a unitary, reflowed photoresist.

21. The method according to claim 6, wherein the convex microlens-color filter structures include no intervening layers or interfaces within the photoresist material.

22. The CMOS image sensor according to claim 1, wherein the microlens-color filter structures include no intervening layers or interfaces within the convex photoresist material.

23. The CMOS image sensor according to claim 13, wherein the microlens-color filter structures include no intervening layers or interfaces within the convex photoresist material.

* * * * *